United States Patent [19]

Smith

[11] Patent Number: 5,021,920

[45] Date of Patent: Jun. 4, 1991

[54] MULTILEVEL INTEGRATED CIRCUIT CAPACITOR AND METHOD OF FABRICATION

[75] Inventor: Gregory C. Smith, Garland, Tex.

[73] Assignee: Texas Instruments Incorporated, Dallas, Tex.

[21] Appl. No.: 502,461

[22] Filed: Mar. 30, 1990

[51] Int. Cl.$^5$ .................... H01G 4/06; B01J 17/00; H01L 23/48

[52] U.S. Cl. .................... 361/311; 357/23.4; 357/51; 437/60

[58] Field of Search ............. 361/311, 312, 313; 365/149; 29/25.42; 437/15, 60, 195; 357/23.6, 51, 23.4

[56] References Cited

U.S. PATENT DOCUMENTS

| | | | |
|---|---|---|---|
| 3,864,817 | 2/1975 | Lapham et al. | 437/60 X |
| 4,685,197 | 8/1987 | Tigelaar et al. | 357/23.6 X |
| 4,890,144 | 12/1989 | Teng et al. | 357/23.4 |

FOREIGN PATENT DOCUMENTS 220960 12/1984 Japan ........................... 357/51

Primary Examiner—Donald A. Griffin
Attorney, Agent, or Firm—James C. Kesterson; James T. Comfort; Melvin Sharp

[57] ABSTRACT

A multilevel capacitor includes a selected number of interleaved conductive layers alternately of first and second conductivity types, each separated by interleaved dielectric layers, forming multilevel capacitor plates. The multilevel capacitor plates include at least first and second contact-edge areas, each including adjacent edges of each interleaved conductive/dielectric layer.

A first electrode of the first conductivity type contacts the first contact-edge area, and a second electrode of the second conductivity type contacts the second contact-edge area. That is, these electrodes contact the corresponding edges of the interleaved conductive/dielectric layers within respective contact-edge areas.

When appropriate bias voltages are applied to the first and second electrodes, each electrode is conductively coupled to the interleaved conductive layers of the same conductivity type, and junction isolated from the interleaved conductive layers of the other conductivity type, thereby permitting alternate layers to be changed to alternate potentials.

11 Claims, 4 Drawing Sheets

MULTILEVEL INTEGRATED CIRCUIT CAPACITOR AND METHOD OF FABRICATION

TECHNICAL FIELD OF THE INVENTION

The invention relates generally to integrated circuits, and more particularly to a multilevel capacitor and a method of fabrication.

BACKGROUND OF THE INVENTION

For integrated circuit capacitors, capacitance is a function of capacitor area on the chip. The chip area allocated to capacitors is particularly significant for integrated circuits such as dynamic RAMs (DRAMs) that use a significant number of capacitive components.

To reduce the chip area that must be allocated to capacitors, the amount of capacitance per unit area must be increased. One technique for increasing capacitance per unit area is to fabricate multilevel capacitors from interleaved conductive and dielectric layers or plates—capacitance per unit area is then proportional to the number of interleaved capacitive plates.

A significant problem with multilevel integrated circuit capacitors, however, is making the appropriate electrode connections to the interleaved capacitor plates. Current techniques for fabricating multilevel capacitors, and in particular, for making electrode connections to the interleaved capacitor plates, require non-standard procedures that are difficult to control.

Accordingly, a need exists for a multilevel integrated circuit capacitor structure that can be fabricated using conventional fabrication processes.

SUMMARY OF THE INVENTION

The invention is a multilevel integrated circuit capacitor structure formed from interleaved capacitor plates of alternate conductivity types, each conductively coupled to an electrode of the same conductivity type and junction isolated from an electrode of the alternate conductivity type.

In one aspect of the invention, a multilevel capacitor includes a selected number of interleaved conductive layers alternately of first and second conductivity types, each separated by interleaved dielectric layers, forming multilevel capacitor plates. The multilevel capacitor plates include at least first and second contact-edge areas, each including adjacent edges of each interleaved conductive/dielectric layer.

A first electrode of the first conductivity type is contacts the first contact-edge area, and a second electrode of the second conductivity type contacts the second contact-edge area. That is, these electrodes contact the corresponding edges of the interleaved conductive/dielectric layers within respective contact-edge areas.

When appropriate bias voltages are applied to the first and second electrodes, each electrode is conductively coupled to the interleaved conductive layers of the same conductivity type, and junction isolated from the interleaved conductive layers of the other conductivity type, thereby permitting alternate layers to be charged to alternate potentials.

In accordance with an exemplary hole fabrication technique, the multilevel capacitor is fabricated by: (a) forming a hole in a surrounding material such that the bottom of the hole is in contact with a electrode region of a first conductivity type and the remaining interior surface of the hole is electrically insulating; (b) conformally forming interleaved conductive/dielectric layers into the hole, with the last interleaved layer being a dielectric layer defining a central gap; (c) anisotropically etching the interleaved layers to remove the interleaved layer material around the top of the hole and in the bottom of the hole within the gap, defining capacitor plates substantially vertically disposed around the interior of the hole with exposed top contact-edges adjacent the top of the hole and exposed bottom contact-edges adjacent the bottom of the hole; (d) forming a bottom electrode by introducing a conductive material of the first conductivity type as a plug in the bottom of the hole which extends over and into contact with the exposed surface of the electrode region and the bottom contact-edges of the multilevel capacitor plates; and (e) forming a top electrode by introducing a conductive material of the second conductivity type which extends over and into contact with the top contact-edges of the multilevel capacitor plates.

In its more specific aspects, this fabrication method involves forming a hole in a dielectric layer, with a conductive electrode region (such as N+ polysilicon) at the bottom of the hole. The interleaved conductive/dielectric layers are formed by conformal in-situ doped polysilicon and dielectric deposition, leaving a gap in the center of the hole.

The multilevel capacitor plates are defined by an anisotropic etch that removes the deposited material from inside the gap, down to the electrode region, and from around the hole, thereby exposing the edges of the interleaved conductive/dielectric layers at the top and bottom of the hole. The bottom electrode is formed by conformally depositing into the gap a doped conductive polysilicon of the same conductivity type as the electrode region at the bottom of the hole, and then anisotropically etching to re-expose the contact-edges at the top of the hole. The top electrode is formed by conformally depositing a conductive polysilicon of the opposite conductivity type over the hole.

In accordance with an exemplary planar fabrication technique, the multilevel capacitor is formed as a stack of interleaved conductive/dielectric layers on a dielectric surface. The last interleaved layer of the multilevel capacitor stack is a dielectric layer. The first and second electrodes extend from the top of the multilevel capacitor stack to the bottom in contact with respective first and second contact-edge areas.

In its more specific aspects, this fabrication method involves forming by planar in-situ doped polysilicon and dielectric deposition interleaved conductive/dielectric layers. These layers are patterned and etched to define a stack of multilevel capacitor plates, which is then covered with dielectric.

A first electrode is formed by patterning and etching a hole in the dielectric to expose a contact-edge area of the multilevel capacitor stack, followed by conformal deposition into the hole polysilicon of a first conductivity type (such as P+). A second electrode is formed in the same manner with polysilicon of the other conductivity type (such as N+). The final step is to form the metal interconnects to the capacitor electrodes.

The technical advantages of the invention include the following. The multilevel capacitor uses junction isolation between a conductive electrode of one conductivity type and interleaved capacitor plates of the opposite conductivity type, thereby permitting alternate plates to be charged to alternate potentials. The multilevel capacitor is fabricated using conventional integreted circuit fabrication processes.

BRIEF DESCRIPTION OF THE DRAWINGS

For a more complete understanding of the invention, and for further features and advantages, reference is now made to the following Detailed Description of an exemplary embodiment of the invention, taken in conjunction with the accompanying Drawings, in which.

DETAILED DESCRIPTION OF THE INVENTION

The Detailed Description of exemplary embodiments of the multilevel integrated circuit capacitor, and fabrication methods, of the invention is organized as follows:
1. Multilevel Capacitor Structure
   1.1. Hole/Conformal Configuration
   1.2. Planar/Stack Configuration
2. Hole Fabrication Technique
   2.1. Hole Preparation
   2.2. Conformal Interleaved Layer Formation
   2.3 Electrode Formation
3. Planar Fabrication Technique
   3.1. Stack Formation
   3.2. Electrode Formation
4. Capacitor Operation
5. Conclusion In accordance with the multilevel capacitor structure of the invention, N+ and P+ capacitor electrodes are connected to interleaved alternate N+/P+ capacitor plates—when appropriately biased, each electrode is conductively connected (ohmic contact) to capacitor plates of the same conductivity type and junction isolated (reverse biased diode junction) from capacitor plates of the opposite conductivity type.

1. Multilevel Capacitor Structure. For the exemplary embodiments, multilevel capacitor structures are defined by two exemplary fabrication techniques: a hole fabrication technique and a planar fabrication technique. The exemplary multilevel capacitor structures are illustrated respectively in FIGS. 1a and 1b—(a) a conformal configuration in FIG. 1a fabricated according to the exemplary hole technique; and (b) a stack configuration in FIG. 1b fabricated according to the planar technique.

Selecting a specific configuration for a multilevel capacitor structure is largely a design choice depending on the preferred fabrication technique and the specification for capacitance per unit area. The multilevel capacitor structure is adaptable to a variety of cross-sectional configurations, including circular, elliptical, square and rectangular. An multilevel capacitor fabricated according to the invention in a cylindrical hole about 1 micron in diameter and about 4 microns deep, with 2N+ and 2P+ interleaved layers each about 1000 Angstroms thick (with 4 interleaved dielectric layers also about 1000 Angstroms thick), would provide a capacitance per unit substrate surface area of about 74 femtofarads per meter$^2$.

Figure 1A:
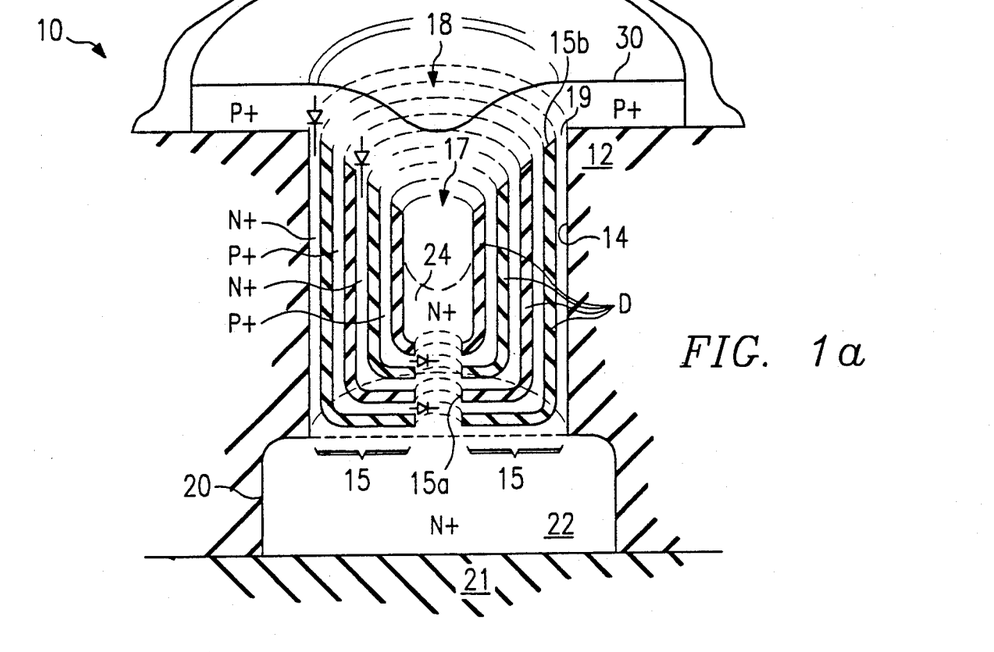
FIGS. 1a and 1b illustrate respective multilevel capacitor structures fabricated according to exemplary embodiments of the invention.

1.1. Hole/Conformal Configuration. FIG. 1a illustrates an exemplary embodiment of the multilevel capacitor structure of the invention fabricated in accordance with the exemplary hole fabrication technique. A multilevel capacitor 10 is fabricated in a dielectric material 12 in which a hole 14 is formed. The dielectric material (such as silicon dioxide) can be formed over a semiconductor substrate or other semiconductor devices. Alternatively, a hole could be formed in a semiconductor substrate and a dielectric layer conformally formed into the hole to provide electrical isolation for the multilevel capacitor.

Multilevel capacitor 10 includes alternate interleaved layers of N+/P+ conductive material, such as N+ and P+ polysilicon, electrically isolated by interleaved layers of dielectric D, conformally disposed in hole 14. These interleaved N+/P+ conductive layers form capacitor plates 15 for the multilevel capacitor.

The interleaved conductive/dielectric layers that form capacitor plates 15 are vertically-disposed down the side of hole 14, extending conformally across a portion of the bottom of the hole. At opposite ends of the interleaved layers are respective bottom vertically-disposed contact-edges 15a adjacent the bottom of hole 14, and top horizontally-disposed contact-edges 15b adjacent the top of the hole.

The last interleaved layer of multilevel capacitor plates 15 is a dielectric layer 17. Dielectric layer 17, together with bottom contact-edges 15b, defines a gap 18 extending through the center of hole 14.

Multilevel capacitor 10 includes an N+ bottom electrode 20 disposed at the bottom of hole 14. Bottom electrode 20 is formed by an N+ electrode region 22 (which may be part of an interconnect line) disposed under the bottom of the hole, and an N+ contact-edge plug 24. The contact-edge plug extends from electrode region 22 into gap 18, into contact with each of the contact-edges 15a adjacent the bottom of the hole. A first interleaved conductive layer 19, which is disposed on the side of hole 14 extending conformally across a portion of the bottom of the hole, corresponds in conductivity to N+ electrode region 22. Thus, N+ bottom electrode 20 is in contact with each of the interleaved conductive layers forming multilevel capacitor plates 15 through contact-edge plug 18 which is in contact with each of contact-edges 15a.

Multilevel capacitor 10 includes a top P+ electrode 30 formed of P+ conductive material (which could be incorporated into an interconnect line). The top electrode is disposed over the top of hole 14 and the adjacent portions of dielectric 14, extending into gap 18 in the center of hole 14. Top electrode 30 contacts each of the contact-edges 15b adjacent the top of hole 14, extending into contact with the contact-edge plug 24.

Thus, P+ top electrode 30 is in contact with each of the interleaved conductive layers forming multilevel capacitor plates 15 through each of contact-edges 15b.

Figure 1B:
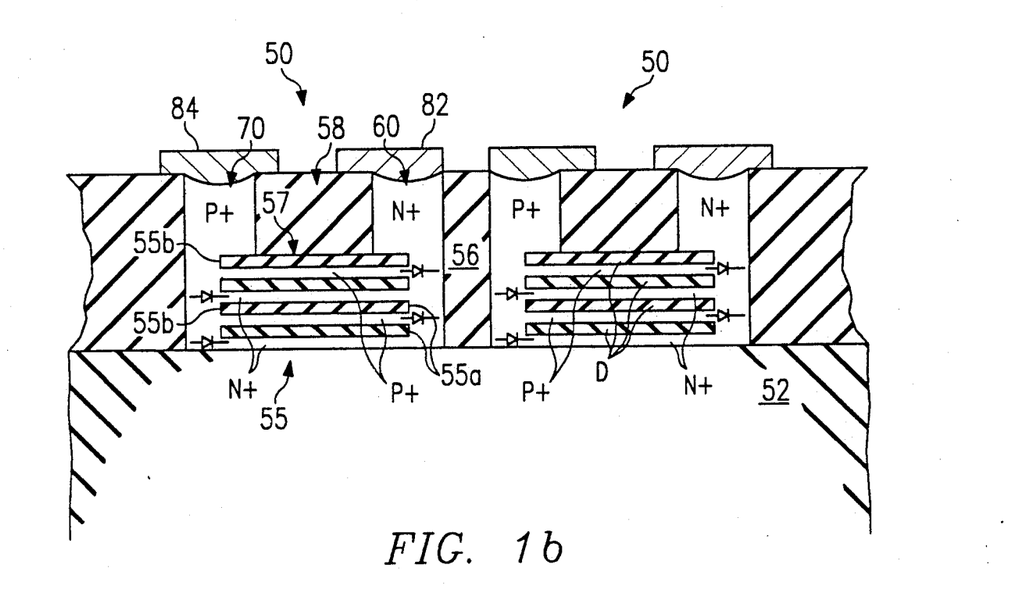

1.2. Planar/Stack Configuration. FIG. 1b illustrates an exemplary embodiment of the multilevel capacitor structure of the invention fabricated in accordance with the exemplary planar fabrication technique.

Identical multilevel capacitors 50 are fabricated on a dielectric base 52. The dielectric base material (such as silicon dioxide) can be formed over a semiconductor substrate or other semiconductor devices.

Multilevel capacitor 50 includes alternate interleaved layers of N+/P+ conductive material, such as N+ and P+ polysilicon, electrically isolated by interleaved layers of dielectric D. These interleaved N+/P+ conductive layers form a multilevel stack of capacitor plates 55 for the multilevel capacitor.

The multilevel stack 55 of interleaved conductive/dielectric layers is disposed on the surface of dielectric base 52. This multilevel stack includes, on opposite sides of the stack, vertically-disposed contact-edges 55a and 55b of the interleaved layers.

Over multilevel stack 55 is a dielectric layer 56, which contacts the top interleaved layer 57 of the capacitor plates and the dielectric base 52. The top interleaved layer 57 of the capacitor plates 55 is a dielectric.

Multilevel capacitor 50 includes an columnar N+ electrode 60 and a columnar P+ electrode 70, each disposed through dielectric layer 56 to the surface of dielectric base 52. N+/P+ electrodes 60/70 are disposed on respective sides of multilevel stack 55 in contact with corresponding contact-edges 55a and 55b.

Thus, N+ electrode 60 is in contact with each of the interleaved conductive layers forming multilevel capacitor plates 55 through each of contact-edges 55a, while P+ electrode 70 is in contact with each of the multilevel capacitor plates through each of contact-edges 55b.

2. Capacitor Operation. Operation of the multilevel capacitor of the invention, and in particular junction isolation, is essentially identical for either the hole/conformal configuration or the planar/stack configuration.

In the multilevel capacitor structure of the invention, the N+/P+ electrodes form ohmic contacts to the edge-coupled interleaved capacitor plates of the same conductivity type, and junction diode contacts to the edge-coupled interleaved capacitor plates of the opposite conductivity type. When appropriately reverse biased, the ohmic junction is conductive, while the reverse-biased junction diode provides junction isolation between the electrode and the corresponding capacitor plate, thereby permitting alternate layers to be charged to alternate potentials.

Referring to the exemplary multilevel capacitor structure illustrated in FIG. 1a, in normal operation, the multilevel capacitor is reverse biased with the N+ bottom electrode 20 at some positive voltage (such as +5 V) relative to the P+ top electrode 30 (which is, for example, tied to ground). With this bias on the N+/P+ electrodes, the N+/P+ diode junctions between the electrodes and the interleaved capacitor plates are reverse biased.

In this reverse bias condition, each electrode is junction isolated from alternate N+/P+ capacitor plates of the same conductivity type (as are the N+/P+ electrodes(which are in contact in gap 18). Junction isolation is represented in FIG. 1 by diode elements at the junctions between the P+ top electrode 20 and the contact-edges of the N+ capacitor plates.

With junction isolation, current flow between the P+ electrode and the alternate N+ capacitive plates is restricted, while the P+/P+ ohmic contact between the P+ electrode and the P+ capacitive plates is conductive, thereby permitting normal capacitive charge/discharge operations. Thus, during charging operations, current flows to the alternate N+/P+ capacitor plates so as to induce a potential difference across each intervening dielectric layer. Correspondingly, during discharge operations, current flows from the alternate N+/P+ capacitor plates, removing charge from the multilevel capacitor.

Selecting an appropriate biasing voltage is a design choice, subject to the requirement that the N+ electrode be sufficiently positive with respect to the P+ electrode to establish a junction isolation condition. Generally, zero volts reverse bias will be adequate to achieve junction isolation permitting normal capacitor operation.

3. Hole Fabrication Technique. The exemplary hole fabrication technique of the invention permits fabrication of a multilevel capacitor using conventional integrated circuit fabrication processes, including conformal in-situ doped polysilicon deposition, dielectric deposition/growth, anisotropic plasma etching, and planarization.

To aid in the understanding of the drawings, it should be noted that FIG. 2 represents the structure of FIG. 1a with 100 added to the label reference numbers.

Figure 2A:
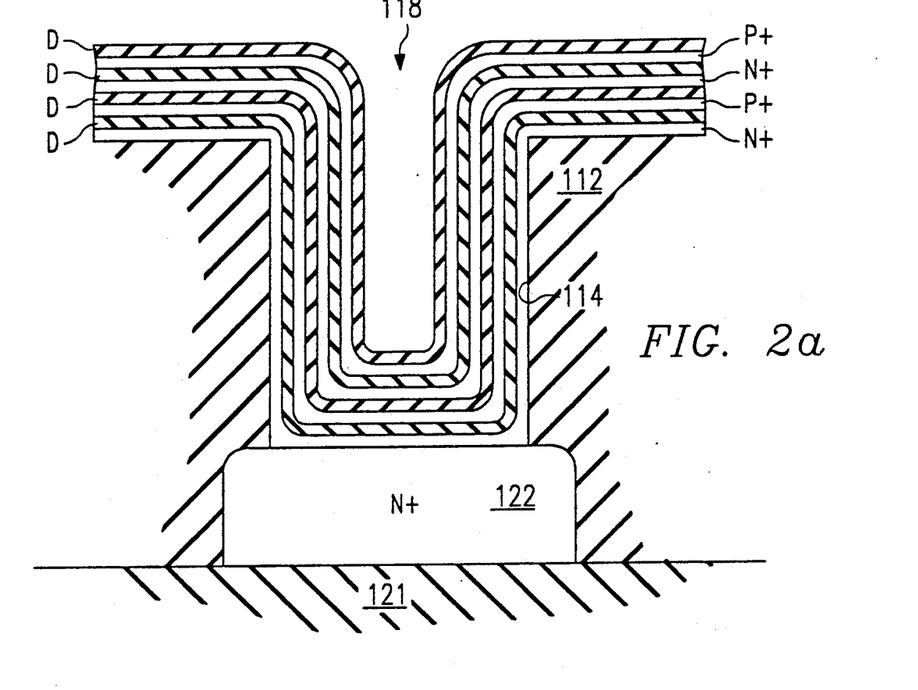
FIGS. 2a-2c illustrate the hole fabrication technique of the invention.

3.1 Hole Preparation. Referring to FIG. 2a, the first fabrication procedure is to form a dielectric layer 112 and prepare a hole 114 for subsequent formation of a multilevel capacitor.

For the exemplary hole fabrication technique, the multilevel capacitor is formed on a dielectric base 121, which could be formed on a semiconductor substrate or over other semiconductor devices. An electrode region 122, which preferably is an interconnect line, is formed onto the dielectric base—the electrode region may be metal or N+ doped polysilicon.

Once electrode region/interconnect 122 is formed, dielectric layer is deposited or grown, and then planarized. The planarization step is controlled so that the thickness of dielectric layer 112 over electrode region 122 on dielectric base 121 corresponds to the desired depth of hole 114.

After planarization, dielectric layer 112 is patterned and etched to create hole 114, which extends from the top of the dielectric layer to the surface of electrode region 122.

3.2. Conformal Interleaved Layer Formation. After hole preparation, the conformal interleaved N+/dielectric/P+ layers of the multilevel capacitor are formed into hole 114.

Referring to FIG. 2a, a layer of N+ doped polysilicon is deposited over substrate 114 and conformally into hole 114. This first interleaved layer is doped N+ to correspond to the N+ electrode region 122. This deposition is followed by the similar depositions of a dielectric layer over the N+ polysilicon, and conformally into hole 114, and a P+ doped polysilicon layer over the dielectric layer, and conformally into hole 114.

These deposition steps are repeated to provide the alternate N+/dielectric/P+ layers that will form the capacitor plates of the multilevel capacitor. The last deposition is a dielectric layer that forms the last interleaved layer of the multilevel capacitor. Typical layer thicknesses are about 1000 Angstroms for the conductive layers, and about 100 Angstroms for the dielectric layers.

The interleaved N+/dielectric/P+ layers are conformally formed into hole 114, extending down the sides and across the bottom of the hole, i.e., over electrode region 122. The conformal deposition provides vertically-disposed interleaved layers formed down the sides of hole 114, which define a gap 118 in the center of hole 114.

Figure 2B:
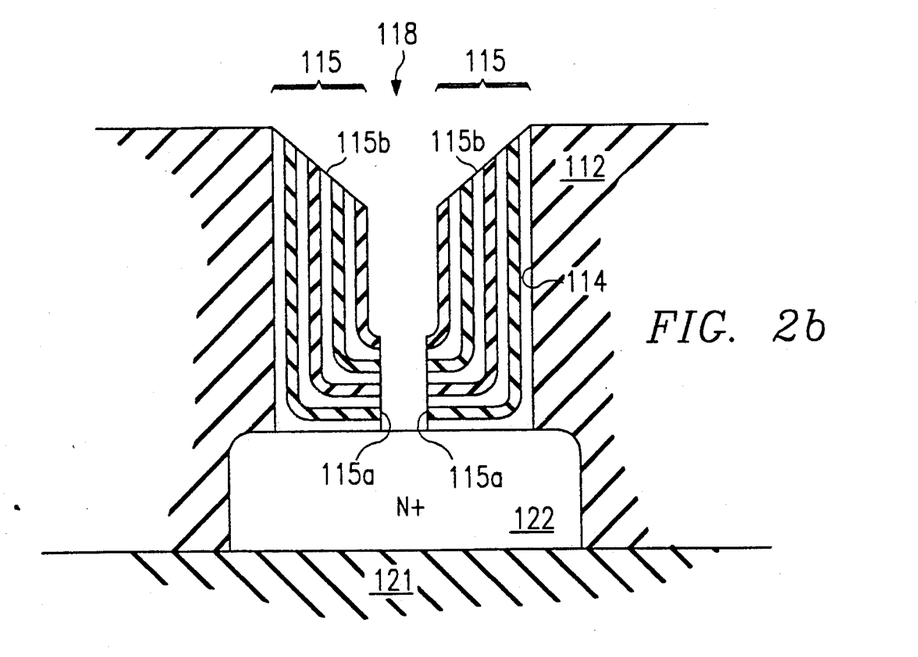

Referring to FIG. 2b, an anisotropic plasma etch is used to etch the interleaved layers. This anisotropic etch is controlled to remove the interleaved layer material from the surface of dielectric layer 112 outside hole 114, and correspondingly from the bottom of the hole within the area of gap 118. That is, the etch leaves vertically-disposed interleaved layers along the sides of hole 114 (which mask the underlying portions of the bottom of the hole).

The remaining interleaved conductive/dielectric layers vertically disposed on the side of hole 114 form the multilevel capacitor plates 115—these plates extend from respective contact-edges 115a adjacent the bottom of the hole to contact-edges 115b adjacent the top of the hole. The exposed contact-edges 115a adjacent the bottom of hole are etched in a substantially vertical profile, while the exposed contact-edges 115b adjacent the top of hole 14 are conformally etched into a curved, substantially horizontal profile.

Figure 2C:
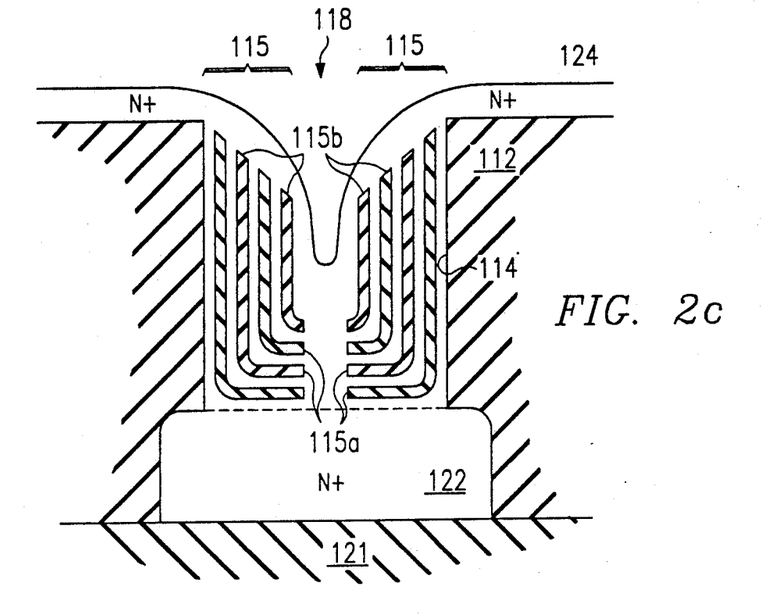

3.3. Electrode Formation. After formation of the interleaved layers that form capacitor plates 115 of the multilevel capacitor, the final fabrication procedures complete formation of the capacitor electrodes.

Referring to FIG. 2c, a layer of N+ doped polysilicon is deposited over the surface of dielectric layer 112, and conformally over multilevel capacitor plates 115 into hole 114. This N+ layer is deposited over the exposed top contact-edges 115b, and into the gap 118, contacting the exposed surface of N+ electrode region 122.

This deposition is controlled such that the N+ polysilicon deposited into the gap 118 extends up into the gap to cover the exposed contact-edges 115a of the capacitor plates adjacent the bottom of hole 114. Thus, gap 118 is plugged by N+ polysilicon, which contacts both the contact-edges 115a of multilevel capacitor plates 115 and the N+ electrode region 122.

This N+ deposition is followed by an anisotropic etch that removes the N+ polysilicon from the surface of dielectric layer 112, and from the top contact-edges 115b of multilevel capacitor plates 115. This anisotropic etch also etchs a portion of the N+ polysilicon within gap 118, although not enough to expose the bottom contact-edges 115a of the multilevel capacitor plates. Thus, the bottom interleaved-layer edges remain covered by an N+ plug 124, which extends from bottom electrode region 122.

The N+ plug 124 together with the N+ electrode region 122 form the N+ bottom electrode for the multilevel capacitor. The N+ bottom electrode is in contact with the bottom contact-edges 115a of the N+/P+ capacitor plates 115 through plug 124. Referring to FIG. 1a, the final fabrication process involves forming top electrode 30.

The surface of dielectric layer 12 is patterned to expose hole 14 and the top contact-edges 115b of multilevel capacitor plates 15, as well as the adjacent portions of dielectric layer 12, P+ polysilicon is then conformally deposited over hole 14, covering the exposed top contact-edges 15, and extending into gap 118 into contact with the N+ electrode plug 24.

Thus, this P+ deposition creates top electrode 30 which is in contact with the top contact-edges of the N+/P+ interleaved layers of multilevel capacitor plates 15. The P+ top electrode 30 also contacts the N+ bottom electrode (specifically, N+ electrode plug 24) in gap 18.

A multilevel capacitor according to the invention is completed by patterning and etching top electrode 30 to form interconnects for charging and discharging the capacitor.

4. Planar Fabrication Technique. The exemplary planar fabrication technique of the invention also permits fabrication of a multilevel capacitor using conventional integrated circuit fabrication processes, including in situ doped polysilicon deposition, dielectric deposition/growth, anisotropic plasma etching, and planarization.

To aid in the understanding of the drawings, at should be noted that FIG. 3 represents the structure of FIG. 1b with 100 added to the label reference numbers.

Referring to FIG. 1b, the first fabrication procedure is to form a dielectric base 52, which can be formed on a semiconductor substrate or over other semiconductor devices. A planarization step provides a planar surface for the fabrication of multilevel capacitors 50.

Figure 3A:
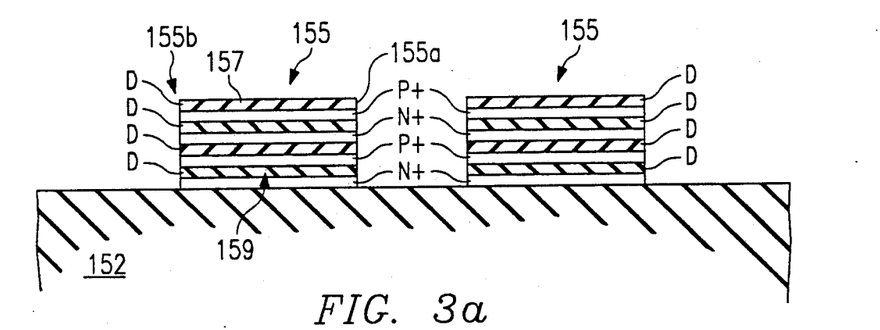
FIGS. 3a-3e illustrate the planar fabrication technique of the invention.

4.1. Stack Formation. Referring to FIG. 3a, multilevel stacks 155 of interleaved N+/dielectric/P+ capacitor plates are formed by successive planar depositions of N+/P+ doped polysilicon and alternate dielectric layers. Typical layer thicknesses are about 1000 Angstroms for the conductive layers, and about 100 Angstroms for the dielectric layers.

These interleaved layers are patterned and etched to form individual multilevel stacks 155 of interleaved capacitor plates. Each multilevel stack 155 includes vertical contact-edges 155a and 115b for each of the interleaved conductive/dielectric layers, disposed on opposite sides of the stack. The last layer of the stack is a dielectric layer 157, while the first layer is an N+ layer 159.

Figure 3B:
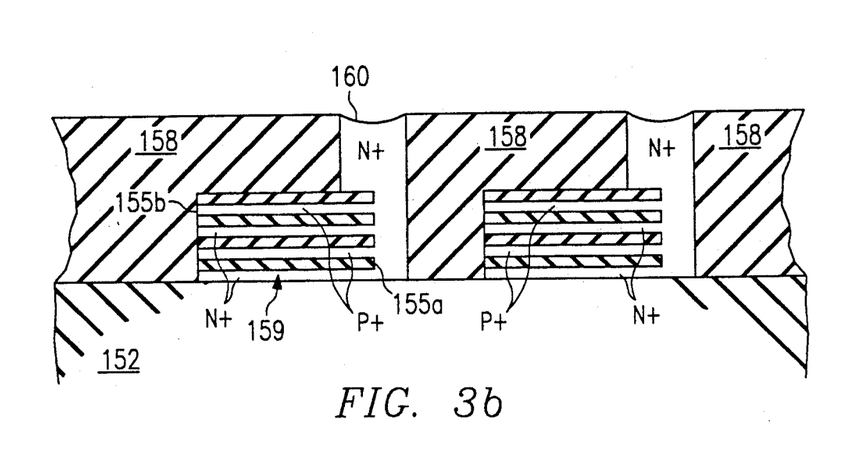

4.2. Electrode Formation. After forming the multilevel capacitor plates, the next fabrication procedures create the N+ and P+ electrodes coupled to those capacitor plates to complete the multilevel capacitor.

Referring to FIG. 3b, the multilevel stacks 155 are covered by a conformal deposition of a dielectric layer 158. The dielectric layer is deposited to a thickness sufficient to capacitively isolate the multilevel capacitors from the next layer of metalization.

The dielectric layer 158 is patterned to expose an area on the side of a multilevel stack 155 including contact-edges 155a. An anisotropic etch is then performed to form a hole 160 for each multilevel stack 155 extending through dielectric layer 158 to the surface of dielectric base 152. This hole exposes the contact-edges 155a of the interleaved conductive/dielectric layers that form the multilevel stack.

An N+ electrode is formed into hole 160 by an N+ in situ doped polysilicon deposition that fills the hole, contacting the contact-edges 155a that lie within the hole. This N+ polysilicon layer is etched back to the surface of the dielectric layer 158, completing formation of the N+ electrode 160.

Figure 3C:
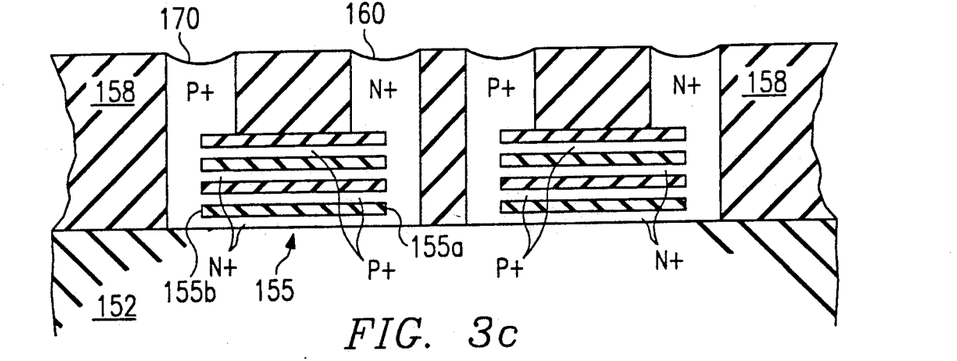

Referring to FIG. 3c, a P+ electrode 170 is formed on the opposite side of each multilevel stack 155, incorporating contact-edges 155b, in the same manner as the N+ electrode is formed.

After electrode formation, a multilevel capacitor 150 includes multilevel capacitor plates 155 edge coupled to N+ and P+ electrodes at respective contact-edges 155a and 155b. Referring to FIG. 1b, fabrication of the multilevel capacitor is completed by forming interconnect lines 82 and 84 for charging and discharging the capacitor. Metal is deposited over the surface of dielectric layer 58, and the N+/P+ electrodes 160 and 170. This metal layer is patterned and etched to form the interconnect lines 82 over the N+ electrode and 84 over the P+ electrode.

Figure 3D:
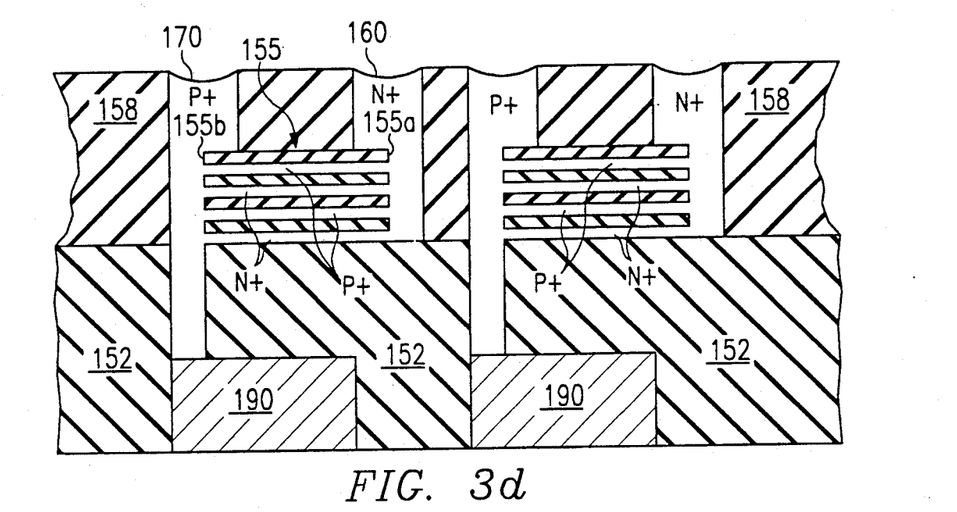
Figure 3E:
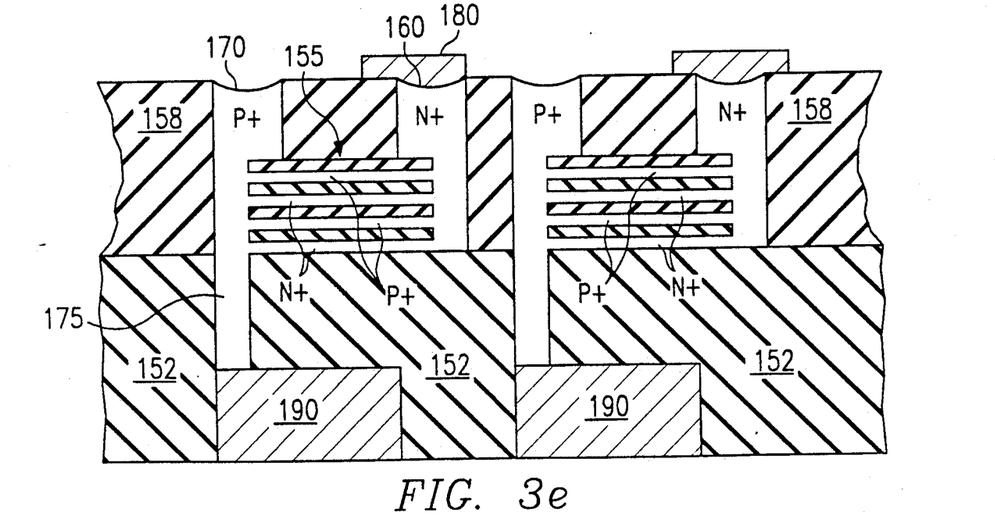

Referring to FIGS. 3d and 3e, an alternate procedure for forming interconnect lines to the multilevel capacitors is to use buried interconnect lines 190 from metal or P+ doped polysilicon. The dielectric base 152 would be formed over these buried interconnect lines.

After formation of multilevel stacks 155 and N+ electrode 160, P+ electrode 170 is formed by etching through to the buried interconnect line 190. The P+ polysilicon deposition forms a P+ electrode that contacts the corresponding contact-edges 155b and extends into contact with the buried interconnect line.

The multilevel capacitor 150 is completed by forming a metal interconnect line 180 for the N+ electrode.

5. Conclusion. Although the invention has been described with respect to specific, exemplary embodiments, various changes and modifications may be suggested to one skilled in the art, and it is intended that the invention encompass such changes and modifications as fall within the scope of the appended claims.

What is claimed is:

1. A multilevel capacitor fabricated as part of a semiconductor device, comprising:
   a selected number of interleaved conductive layers alternately of first and second conductivity types, each separated by an interleaved dielectric layer;
   said conductive layers interleaved with said dielectric layers forming multilevel capacitor plates;
   said multilevel capacitor including at least first and second contact-edge areas, each including adjacent edges of each interleaved conductive and dielectric layer;
   a first electrode of the first conductivity type contacting said first contact-edge area at each corresponding edge of the interleaved conductive and dielectric layers; and
   a second electrode of the second conductivity type contacting said contact-edge area at each corresponding edge of the interleaved conductive and dielectric layers;
   such that, when appropriate bias voltages are placed on said first and second electrodes, each electrode is conductively connected to said interleaved conductive layers of the same conductivity type and junction isolated from said interleaved conductive layers of the other conductivity type, thereby permitting alternate layers to be charged to alternate potentials.

2. The multilevel capacitor of claim 1, wherein:
   said multilevel capacitor is disposed in a hole defined by a surface of a dielectric material;
   said interleaved conductive/dielectric layers being substantially vertically disposed around the interior of said hole, with the first layer being a conductive layer disposed onto the dielectric surface of said hole;
   the last interleaved layer of said multilevel capacitor being a dielectric layer defining a central gap extending from the top of said hole to the bottom;
   said first contact-edge area being disposed adjacent the bottom of said hole, and said second contact-edge area being disposed adjacent the top of said hole;
   said first electrode being disposed in the gap in said multilevel capacitor in contact with said first contact-edge area; and
   said second electrode being disposed over the top of said hole in contact with said second contact-edge area.

3. The multilevel capacitor of claim 2, wherein said hole is formed in a layer of dielectric material.

4. The multilevel capacitor of claim 1, wherein:
   said multilevel capacitor is disposed as a stack of interleaved conductive/dielectric layers on a dielectric surface;
   the last interleaved layer of said multilevel capacitor stack being a dielectric layer;
   said first and second electrodes extending from the top of said multilevel capacitor stack to the bottom in contact with respective first and second contact-edge areas.

5. A multilevel capacitor fabricated onto a semiconductor device, comprising:
   a hole defined by a surface of dielectric material;
   a first electrode region of a first conductivity type disposed at the bottom of said hole;
   a selected number of interleaved layers substantially vertically disposed around the interior of said hole, said interleaved layers being alternately of first and second conductivity types separated by interleaved layers of dielectric material, forming a multilevel capacitor;
   said multilevel capacitor including at least a first contact-edge area disposed adjacent the bottom of said hole and a second contact-edge area disposed adjacent the top of said hole, each contact-edge area including adjacent edges of each interleaved conductive/ dielectric layer;
   the first layer of said multilevel capacitor being a conductive layer of the first conductivity type extending along the dielectric surface of said hole to contact said first electrode region;
   the last layer of said multilevel capacitor being a dielectric layer that defines a gap in the center of said hole extending from the top of said hole to said first electrode region;
   a first electrode plug of the first conductivity type extending from said first electrode region into contact with said first contact-edge area, forming a first electrode; and
   a second electrode of the second conductivity type extending over the top of said hole into contact with said second contact-edge area;
   such that, when appropriate bias voltages are placed on said first and second electrodes, each electrode is electrically connected to said interleaved conductive layers of the same conductivity type and junction isolated from said interleaved conductive layers of the other conductivity type, thereby permitting alternate layers to be charged to alternate potentials.

6. The multilevel capacitor of claim 5, wherein said multilevel capacitor layers are conformally formed into said hole, and anisotropically etched to expose said first and second contact-edge areas of said hole, and the bottom of said hole within said gap.

7. The multilevel capacitor of claim 6, wherein said edge-coupling extension comprises a layer of conductive material of said first conductivity type formed over said hole and into said hole gap anisotropically etched to expose the top edges of said interleaved layers of said multilevel sections while leaving said edge-coupling extension in contact with the bottom edges of said interleaved layers of said multilevel sections.

8. The multilevel capacitor of claim 5, wherein said electrode layer extends across a substantial portion of the last dielectric layers of said multilevel sections.

9. The multilevel capacitor of claim 5, wherein said conductive and dielectric layers forming each multilayer capacitor extend from adjacent the top of said hole conformally across a portion of the bottom of said hole, with the first interleaved layers contacting the underlying portions of said bottom-electrode region.

10. The multilevel capacitor of claim 5, wherein the material of said first conductivity type comprises polysilicon doped N+, and the material of said second conductivity type comprises polysilicon doped P+.

11. A method of fabricating a multilevel capacitor in an integrated circuit substrate of dielectric material, comprising the steps:

forming a hole in the substrate;

forming a bottom-electrode region of a first conductivity type in the substrate at the bottom of said hole;

conformally forming in said hole, and over the substrate adjacent said hole, a selected number of interleaved conductive layers alternately of first and second conductivity types, each separated by an interleaved layer of dielectric material, leaving a hole gap in the center of said hole;

the first such layer being a conductive layer of the first conductivity type, and the last layer being a dielectric layer the defines said hole gap;

anisotropically etching said interleaved layers to expose the substrate adjacent said hole and said bottom-electrode region in the central portion of the bottom of said hole, and to expose the edges of said interleaved layers adjacent the top and the bottom of said hole, thereby defining separate multilevel sections vertically disposed on opposite holes of said hole;

forming a hole electrode by forming an edge-coupling layer of the first conductivity type over said hole and into said hole gap, in electrical contact with said bottom-electrode region and the adjacent ends or the interleaved conductive layers of said multilevel sections exposed by said anistropic etch;

anisotropically etching said edge-coupling layer to expose the ends of said interleaved layers adjacent the top of said hole while leaving said edge-coupling layer in contact with the bottom edges of the interleaved layers of said multilevel sections; and conformally forming a surface electrode of the second conductivity type over and into said hole, in electrical contact with the adjacent ends of the interleaved layers of said multilevel sections exposed by the second anisotropic etching step.

* * * * *